(12) United States Patent  
Yung et al.

(10) Patent No.: US 9,074,070 B2  
(45) Date of Patent: Jul. 7, 2015

(54) THERMOPLASTIC COMPOSITION FOR USE IN FORMING A LASER DIRECT STRUCTURED SUBSTRATE

(71) Applicant: Ticona LLC, Florence, KY (US)

(72) Inventors: Paul C. Yung, Cincinnati, OH (US); Rong Luo, Florence, KY (US)

(73) Assignee: Ticona LLC, Florence, KY (US)

( * ) Notice: Subject to any disclaimer, the term of this patent is extended or adjusted under 35 U.S.C. 154(b) by 278 days.

(21) Appl. No.: 13/658,063

(22) Filed: Oct. 23, 2012

(65) Prior Publication Data

US 2013/0106659 A1     May 2, 2013

Related U.S. Application Data

(60) Provisional application No. 61/553,418, filed on Oct. 31, 2011, provisional application No. 61/673,352, filed on Jul. 19, 2012.

(51) Int. Cl.

| | | |
|---|---|---|
| *C08K 3/22* | (2006.01) | |
| *C09K 19/38* | (2006.01) | |
| *C08K 3/04* | (2006.01) | |

(Continued)

(52) U.S. Cl.

CPC ... *C08K 3/36* (2013.01); *C08K 3/22* (2013.01); *C09K 19/38* (2013.01)

(58) Field of Classification Search

CPC .............. C08K 3/04; C08K 3/22; C08K 3/40; C08K 5/49; C08K 7/02; C08K 7/14; C08K 2003/2206; C08K 2003/2217; C08K 2003/2227; C08K 2003/2237; C08K 2003/2241; C08K 2003/2248; C08K 2003/2251; C08K 2003/2265; C08K 2003/2293; C08K 2003/2296; C08K 2201/001; C08K 67/03

USPC ................... 252/299.01, 299.5; 524/435, 436

See application file for complete search history.

(56) References Cited

U.S. PATENT DOCUMENTS

| | | |
|---|---|---|
| 4,083,829 A | 4/1978 | Calundann et al. |
| 4,161,470 A | 7/1979 | Calundann |

(Continued)

FOREIGN PATENT DOCUMENTS

| | | |
|---|---|---|
| CN | 1109405 A | 10/1995 |
| CN | 102066122 A | 5/2011 |

(Continued)

OTHER PUBLICATIONS

Search Report and Written Opinion for PCT/US2012/061424 dated Oct. 16, 2013, 12 pages.

(Continued)

*Primary Examiner* — Shean C Wu

(74) *Attorney, Agent, or Firm* — Dority & Manning, P.A.

(57) ABSTRACT

A thermoplastic composition that contains a unique combination of a thermotropic liquid crystalline polymer, dielectric material, laser activatable additive, and a fibrous filler is provided. The nature of the components and/or their concentration are selectively controlled in the present invention to maintain a high dielectric constant, good mechanical properties (e.g., deflection under load), and good processibility (e.g., low viscosity), yet still be laser activatable. Thus, the thermoplastic composition can be readily shaped into a thin substrate and subsequently applied with one or more conductive elements using a laser direct structuring process ("LDS").

39 Claims, 3 Drawing Sheets

(51) Int. Cl.
*C08K 3/40* (2006.01)
*C08L 67/03* (2006.01)
*C08K 3/36* (2006.01)

(56) References Cited

U.S. PATENT DOCUMENTS

| | | |
|---|---|---|
| 4,184,996 A | 1/1980 | Calundann |
| 4,209,430 A | 6/1980 | Weber |
| 4,219,461 A | 8/1980 | Calundann |
| 4,256,624 A | 3/1981 | Calundann |
| 4,279,803 A | 7/1981 | Calundann |
| 4,318,841 A | 3/1982 | East et al. |
| 4,330,457 A | 5/1982 | East et al. |
| 4,337,190 A | 6/1982 | Calundann |
| 4,339,375 A | 7/1982 | Calundann |
| 4,351,917 A | 9/1982 | Calundann et al. |
| 4,351,918 A | 9/1982 | Charbonneau et al. |
| 4,355,132 A | 10/1982 | East et al. |
| 4,355,134 A | 10/1982 | Charbonneau et al. |
| 4,375,530 A | 3/1983 | Hay et al. |
| 4,393,191 A | 7/1983 | East |
| 4,421,908 A | 12/1983 | East |
| 4,429,105 A | 1/1984 | Charbonneau |
| 4,434,262 A | 2/1984 | Buckley et al. |
| 4,473,680 A | 9/1984 | Watson |
| 4,522,974 A | 6/1985 | Calundann et al. |
| 5,204,443 A | 4/1993 | Lee et al. |
| 5,508,374 A | 4/1996 | Lee et al. |
| 5,541,240 A | 7/1996 | Makhija et al. |
| 5,576,073 A | 11/1996 | Kickelhain |
| 5,593,739 A | 1/1997 | Kickelhain |
| 5,616,680 A | 4/1997 | Linstid, III |
| 5,630,272 A | 5/1997 | Wenke |
| 5,679,456 A * | 10/1997 | Sakai et al. ............... 428/340 |
| 5,750,212 A | 5/1998 | Kickelhain |
| 5,955,179 A | 9/1999 | Kickelhain et al. |
| 5,969,083 A | 10/1999 | Long et al. |
| 6,114,492 A | 9/2000 | Linstid, III et al. |
| 6,146,764 A | 11/2000 | Suokas et al. |
| 6,319,564 B1 | 11/2001 | Naundorf et al. |
| 6,514,611 B1 | 2/2003 | Shepherd et al. |
| 6,627,845 B2 | 9/2003 | Kusnezow |
| 6,643,552 B2 | 11/2003 | Edell et al. |
| 6,696,173 B1 | 2/2004 | Naundorf et al. |
| 6,825,251 B2 | 11/2004 | El-Shoubary et al. |
| 6,881,291 B2 | 4/2005 | Platz |
| 6,897,568 B2 | 5/2005 | Haimerl et al. |
| 6,906,928 B2 | 6/2005 | Hauser et al. |
| 6,956,287 B2 | 10/2005 | Hedler et al. |
| 7,060,421 B2 | 6/2006 | Naundorf et al. |
| 7,083,848 B2 | 8/2006 | Kliesch et al. |
| 7,105,223 B2 | 9/2006 | Kliesch et al. |
| 7,112,365 B2 | 9/2006 | Kliesch et al. |
| 7,259,195 B2 | 8/2007 | El-Shoubary et al. |
| 7,291,380 B2 | 11/2007 | Nyholm et al. |
| 7,312,533 B2 | 12/2007 | Haimerl et al. |
| 7,504,150 B2 | 3/2009 | Lee et al. |
| 7,531,204 B2 | 5/2009 | Lee et al. |
| 7,547,849 B2 | 6/2009 | Lee et al. |
| 7,578,888 B2 | 8/2009 | Schildmann |
| 8,334,066 B2 | 12/2012 | Hong et al. |
| 2004/0135118 A1 | 7/2004 | Waggoner |
| 2005/0274933 A1 | 12/2005 | Chen et al. |
| 2005/0276911 A1 | 12/2005 | Chen et al. |
| 2006/0182881 A1 | 8/2006 | Montano et al. |
| 2009/0292048 A1 * | 11/2009 | Li et al. ................ 524/115 |
| 2009/0292051 A1 * | 11/2009 | Li et al. ................ 524/404 |
| 2010/0243844 A1 | 9/2010 | Peloza et al. |
| 2010/0323235 A1 | 12/2010 | Takami et al. |
| 2012/0015235 A1 | 1/2012 | Fuhr et al. |
| 2013/0078500 A1 | 3/2013 | Takami et al. |

FOREIGN PATENT DOCUMENTS

| | | |
|---|---|---|
| CN | 102066473 A | 5/2011 |
| WO | WO 2009141799 A1 | 11/2009 |
| WO | WO 2010085636 A2 | 7/2010 |
| WO | WO 2010085636 A3 | 7/2010 |
| WO | WO 2013066683 A2 | 5/2013 |
| WO | WO 2013066683 A3 | 5/2013 |

OTHER PUBLICATIONS

Abstract of Argentinian Patent—AT290766, Mar. 15, 2005, 1 page.
Abstract of Australian Patent—AU2002319088, Jan. 21, 2003, 1 page.
Abstract of Chinese Patent—CN1518850, Aug. 4, 2004, 1 page.
Abstract of German Patent—DE10132092, Jan. 23, 2003, 1 page.
Abstract of Denmark Patent—DK1274288, Jun. 6, 2005, 1 page.
Abstract of European Patent—EP1274288, Jan. 8, 2003, 1 page.
Abstract of Spanish Patent—ES2238380, Sep. 1, 2005, 1 page.
Abstract of Japanese Patent—JP2004534408, Nov. 11, 2004, 1 page.
Abstract of Portuguese Patent—PT1274288, Jun. 30, 2005, 1 page.
Abstract of WO Patent—WO03005784, Jan. 16, 2003, 1 page.
Material Safety Data Sheet from Millennium Chemicals, MSDS No. 5. 12, Jan. 15, 2003, 7 pages.
Medical Design Briefs—Molded Interconnect Device Technology Enables Smaller Medical Devices, 2010, Harting, Inc., 2 pages.
Press Release—LPKF and Ticona for Laser Direct Structure (LDS) with Vectra® LCP, Oct. 2003, 1 page.
Product Data Sheet for TiONA® RCL-4, Titanium Dioxide Pigment, Jun. 2009, Cristal Global.
Product Description—DuPont™ Ti-Pure® R-105, Titanium Dioxide from E. I. du Pont de Nemours and Company, 2007, 2 pages.
Product Information—Vectra®—Liquid Crystal Polymer (LCP) from Ticona, 1 page 13, 2001.
Partial International Search Report for PCT/US2012/061424 dated Feb. 19, 2013, 2 pages.
Explanation of Relevance.
Search Report from China dated Mar. 10, 2015, 2 pages.

* cited by examiner

THERMOPLASTIC COMPOSITION FOR USE IN FORMING A LASER DIRECT STRUCTURED SUBSTRATE

CROSS REFERENCE TO RELATED APPLICATIONS

The present application claims filing benefit of U.S. Provisional Patent Application Ser. No. 61/553,418 having a filing date of Oct. 31, 2011, and of U.S. Provisional Patent Application Ser. No. 61/673,352 having a filing date of Jul. 12, 2012, all of which are incorporated herein by reference in their entirety.

BACKGROUND OF THE INVENTION

Electronic components, such as portable computers and handheld electronic devices, are becoming increasingly popular and are often provided with wireless communications capabilities. For example, electronic components may use long-range wireless communications circuitry to communicate using cellular telephone bands at 850 MHz, 900 MHz, 1800 MHz, and 1900 MHz (e.g., the main Global System for Mobile Communications or GSM cellular telephone bands). Electronic components may also use short-range wireless communications links to handle communications with nearby equipment. For example, electronic components may communicate using the WiFi® (IEEE 802.11) bands at 2.4 GHz and 5 GHz (sometimes referred to as local area network bands) and the Bluetooth® band at 2.4 GHz. To form the antenna structure of such electronic components, molded interconnect devices ("MID") often contain a plastic substrate on which is formed conductive elements or pathways. Such MID devices are thus three-dimensional molded parts having an integrated printed conductor or circuit layout, which saves space for use in smaller devices (e.g., cellular phones). It is becoming increasingly popular to form MIDs using a laser direct structuring ("LDS") process during which a computer-controlled laser beam travels over the plastic substrate to activate its surface at locations where the conductive path is to be situated. With a laser direct structuring process, it is possible to obtain conductive element widths and spacings of 150 microns or less. As a result, MIDs formed from this process save space and weight in the end-use applications. Another advantage of laser direct structuring is its flexibility. If the design of the circuit is changed, it is simply a matter of reprogramming the computer that controls the laser. This greatly reduces the time and cost from prototyping to producing a final commercial product.

Various materials have been proposed for forming the plastic substrate of a laser direct structured-MID device. For example, one such material is a blend of polycarbonate, acrylonitrile butadiene styrene ("ABS"), copper chromium oxide spinel, and a bisphenol A diphenyl phosphate ("BPADP") flame retardant. One problem with such materials, however, is that the flame retardant tends to adversely impact the mechanical properties (e.g., deformation temperature under load) of the composition, which makes it difficult to use in laser direct structuring processes. Such materials are also unsuitable for lead free soldering processes (surface mount technology) that require high temperature resistance. Another problem is that the materials tend to have a low dielectric constant, which makes it difficult to use them in applications where it is desired to include more than one antenna in the device. To this end, various high dielectric materials have been proposed. For instance, one material that has been proposed includes a blend of polyphenylene oxide, nylon, or polyamide with barium titanate and copper chromium oxide spinel. Unfortunately, with these materials, high loadings of barium titanate are generally required to achieve the desired dielectric constant, which has an adverse impact on mechanical properties and pressure required to fill a thin walled part in injection molding. In addition, many flame retardants tend to corrode the mold and screw used in injection molding.

As such, a need exists for a thermoplastic composition that can be activated by laser direct structuring and has a relatively high dielectric constant, but still maintain excellent mechanical properties and processibility (e.g., low viscosity).

SUMMARY OF THE INVENTION

In accordance with one embodiment of the present invention, a thermoplastic composition is disclosed that comprises from about 20 wt. % to about 80 wt. % of at least one thermotropic liquid crystalline polymer; from about 0.1 wt. % to about 30 wt. % of at least one laser activatable additive, wherein the laser activatable additive includes spinel crystals; from about 1 wt. % to about 50 wt. % of at least one dielectric material; and from about 5 wt. % to about 50 wt. % of at least one fibrous filler. The weight ratio of the fibrous filler to the combined amount of the laser activatable additive and the dielectric material is from about 0.4 to about 2.0. The thermoplastic composition exhibits a dielectric constant of greater than about 4.4, as determined at a frequency of 2 GHz. Further, the melting temperature of the thermoplastic composition is from about 250° C. to about 440° C. and the ratio of the deflection temperature under load to the melting temperature is from about 0.67 to about 1.00, the deflection temperature under load being determined in accordance ISO Test No. 75-2 at a load of 1.8 Megapascals.

In accordance with another embodiment of the present invention, a thermoplastic composition is disclosed that comprises a thermotropic liquid crystalline polymer having a total amount of repeating units derived from naphthenic hydroxycarboxylic and/or naphthenic dicarboxylic acids of about 10 mol. % or more, a laser activatable additive, a dielectric material, and a fibrous filler. The laser activatable additive includes spinel crystals.

In accordance with yet another embodiment of the present invention, an antenna structure is disclosed that comprises a substrate and one or more antennae formed on the substrate. The substrate includes a thermoplastic composition comprising at least one thermotropic liquid crystalline polymer, at least one laser activatable additive that includes spinel crystals, at least one dielectric material, and at least one fibrous filler, wherein the weight ratio of the fibrous filler to the combined amount of the laser activatable additive and the dielectric material is from about 0.4 to about 2.0. If desired, the antenna structure may be incorporated into an electronic component, such as a cellular telephone.

Other features and aspects of the present invention are set forth in greater detail below.

BRIEF DESCRIPTION OF THE FIGURES

A full and enabling disclosure of the present invention, including the best mode thereof to one skilled in the art, is set forth more particularly in the remainder of the specification, including reference to the accompanying figures, in which.

DETAILED DESCRIPTION

Figure 1:
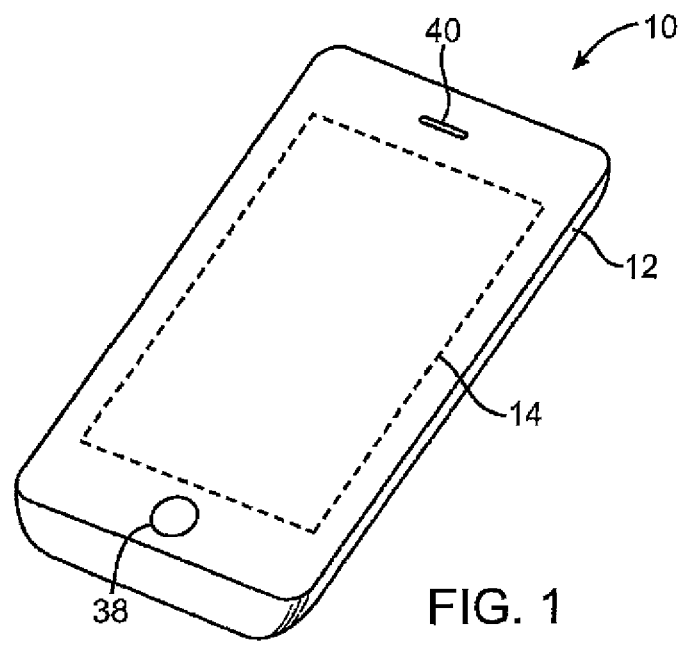
FIGS. 1-2 are respective front and rear perspective views of one embodiment of an electronic component that can employ an antenna structure formed according to the present invention.

It is to be understood by one of ordinary skill in the art that the present discussion is a description of exemplary embodiments only, and is not intended as limiting the broader aspects of the present invention.

Generally speaking, the present invention is directed to a thermoplastic composition that contains a unique combination of a thermotropic liquid crystalline polymer, dielectric material, laser activatable additive, and a fibrous filler. The nature of the components and/or their concentration are selectively controlled in the present invention to maintain a high dielectric constant, good mechanical properties (e.g., deflection under load), and good processibility (e.g., low viscosity), yet still be laser activatable. Thus, the thermoplastic composition can be readily shaped into a substrate that can be subsequently applied with one or more conductive elements using a laser direct structuring process ("LDS"). Due to the beneficial properties of the thermoplastic composition, the resulting substrate may have a very small size, such as a thickness of about 5 millimeters or less, in some embodiments about 4 millimeters or less, and in some embodiments, from about 0.5 to about 3 millimeters. If desired, the conductive elements may be antennas (e.g., antenna resonating elements) so that the resulting part is an antenna structure that may be employed in a wide variety of different electronic components, such as cellular telephones.

Various embodiments of the present invention will now be described in greater detail.

As indicated above, the thermoplastic composition of the present invention employs at least one thermotropic liquid crystalline polymer. The amount of such liquid crystalline polymers is typically from about 20 wt. % to about 80 wt. %, in some embodiments from about 30 wt. % to about 75 wt. %, and in some embodiments, from about 40 wt. % to about 70 wt. % of the thermoplastic composition. Suitable thermotropic liquid crystalline polymers may include aromatic polyesters, aromatic poly(esteramides), aromatic poly(estercarbonates), aromatic polyamides, etc., and may likewise contain repeating units formed from one or more aromatic hydroxycarboxylic acids, aromatic dicarboxylic acids, aromatic diols, aromatic aminocarboxylic acids, aromatic amines, aromatic diamines, etc., as well as combinations thereof.

Aromatic polyesters, for instance, may be obtained by polymerizing (1) two or more aromatic hydroxycarboxylic acids; (2) at least one aromatic hydroxycarboxylic acid, at least one aromatic dicarboxylic acid, and at least one aromatic diol; and/or (3) at least one aromatic dicarboxylic acid and at least one aromatic diol. Examples of suitable aromatic hydroxycarboxylic acids include, 4-hydroxybenzoic acid; 4-hydroxy-4'-biphenylcarboxylic acid; 2-hydroxy-6-naphthoic acid; 2-hydroxy-5-naphthoic acid; 3-hydroxy-2-naphthoic acid; 2-hydroxy-3-naphthoic acid; 4'-hydroxyphenyl-4-benzoic acid; 3'-hydroxyphenyl-4-benzoic acid; 4'-hydroxyphenyl-3-benzoic acid, etc., as well as alkyl, alkoxy, aryl and halogen substituents thereof. Examples of suitable aromatic dicarboxylic acids include terephthalic acid; isophthalic acid; 2,6-naphthalenedicarboxylic acid; diphenyl ether-4,4'-dicarboxylic acid; 1,6-naphthalenedicarboxylic acid; 2,7-naphthalenedicarboxylic acid; 4,4'-dicarboxybiphenyl; bis(4-carboxyphenyl)ether; bis(4-carboxyphenyl)butane; bis(4-carboxyphenyl)ethane; bis(3-carboxyphenyl)ether; bis(3-carboxyphenyl)ethane, etc., as well as alkyl, alkoxy, aryl and halogen substituents thereof. Examples of suitable aromatic diols include hydroquinone; resorcinol; 2,6-dihydroxynaphthalene; 2,7-dihydroxynaphthalene; 1,6-dihydroxynaphthalene; 4,4'-dihydroxybiphenyl; 3,3'-dihydroxybiphenyl; 3,4'-dihydroxybiphenyl; 4,4'-dihydroxybiphenyl ether; bis(4-hydroxyphenyl)ethane, etc., as well as alkyl, alkoxy, aryl and halogen substituents thereof.

In one particular embodiment, the aromatic polyester contains monomer repeat units derived from 4-hydroxybenzoic acid ("HBA") and 2,6-hydroxynaphthoic acid ("HNA") and/or 2,6-naphthalenedicarboxylic acid ("NDA"), as well as other optional repeat units, such as terephthalic acid ("TA") and/or isophthalic acid ("IA"); hydroquinone ("HQ"), 4,4-biphenol ("BP"), and/or acetaminophen ("APAP"); etc., as well as a combination thereof. The monomer units derived from HBA may constitute from about 40% to about 75% of the polymer on a mole basis and the monomer units derived from HNA and/or NDA may constitute from about 1% to about 25% of the polymer on a mole basis. The monomer units derived from TA and/or IA may constitute from about 2% to about 25% of the polymer on a mole basis. Likewise, the monomer units derived from HQ, BP, and/or APAP may constitute from about 10% to about 35% of the polymer on a mole basis. Suitable aromatic polyesters are commercially available from Ticona LLC under the trade designation VECTRA® A. The synthesis and structure of these and other aromatic polyesters may be described in more detail in U.S. Pat. Nos. 4,161,470; 4,473,682; 4,522,974; 4,375,530; 4,318,841; 4,256,624; 4,219,461; 4,083,829; 4,184,996; 4,279,803; 4,337,190; 4,355,134; 4,429,105; 4,393,191; 4,421,908; 4,434,262; and 5,541,240.

Liquid crystalline polyesteramides may likewise be obtained by polymerizing (1) at least one aromatic hydroxycarboxylic acid and at least one aromatic aminocarboxylic acid; (2) at least one aromatic hydroxycarboxylic acid, at least one aromatic dicarboxylic acid, and at least one aromatic amine and/or diamine optionally having phenolic hydroxy groups; and (3) at least one aromatic dicarboxylic acid and at least one aromatic amine and/or diamine optionally having phenolic hydroxy groups. Suitable aromatic amines and diamines may include, for instance, 3-aminophenol; 4-aminophenol; 1,4-phenylenediamine; 1,3-phenylenediamine, etc., as well as alkyl, alkoxy, aryl and halogen substituents thereof. In one particular embodiment, the aromatic polyesteramide contains monomer units derived from 2,6-hydroxynaphthoic acid, terephthalic acid, and 4-aminophenol. The monomer units derived from 2,6-hydroxynaphthoic acid may constitute from about 35% to about 85% of the polymer on a mole basis (e.g., 60%), the monomer units derived from terephthalic acid may constitute from about 5% to about 50% (e.g., 20%) of the polymer on a mole basis, and the monomer units derived from 4-aminophenol may constitute from about 5% to about 50% (e.g., 20%) of the polymer on a mole basis. Such aromatic polyesters are commercially available from Ticona LLC under the trade designation VECTRA® B. In another embodiment, the aromatic polyesteramide contains monomer units derived from 2,6-hydroxynaphthoic acid, and 4-hydroxybenzoic acid, and 4-aminophenol, as well as other optional monomers (e.g., 4,4'-dihydroxybiphenyl and/or terephthalic acid). The synthesis and structure of these and other aromatic poly(esteramides) may be described in more detail in U.S. Pat. Nos. 4,339,375; 4,355,132; 4,351,917; 4,330,457; 4,351,918; and 5,204,443.

In certain embodiments of the present invention, the liquid crystalline polymer may be a "naphthenic-rich" polymer to the extent that it contains a relatively high content of repeating units derived from naphthenic hydroxycarboxylic acids and/or naphthenic dicarboxylic acids, such as naphthalene-2,6-dicarboxylic acid ("NDA"), 6-hydroxy-2-naphthoic acid ("HNA"), or combinations thereof. The present inventor has discovered that such naphthenic-rich can improve the electrical properties of the composition, such as by reducing the dissipation factor. For example, the total amount of repeating units derived from naphthenic hydroxycarboxylic and/or dicarboxylic acids (e.g., NDA, HNA, or a combination of HNA and NDA) may be about 10 mol. % or more, in some embodiments about 15 mol. % or more, and in some embodiments, from about 18 mol. % to about 50 mol. % of the polymer. In one particular embodiment, for example, a "naphthenic-rich" aromatic polyester may be formed that contains monomer repeat units derived from a naphthenic acid (e.g., NDA and/or HNA); 4-hydroxybenzoic acid ("HBA"), terephthalic acid ("TA") and/or isophthalic acid ("IA"); as well as various other optional constituents. The monomer units derived from 4-hydroxybenzoic acid ("HBA") may constitute from about 20 mol. % to about 70 mol. %, in some embodiments from about 30 mol. % to about 65 mol. %, and in some embodiments, from about 35 mol. % to about 60 mol. % of the polymer, while the monomer units derived from terephthalic acid ("TA") and/or isophthalic acid ("IA") may each constitute from about 1 mol. % to about 30 mol. %, in some embodiments from about 2 mol. % to about 25 mol. %, and in some embodiments, from about 3 mol. % to about 20 mol. % of the polymer. Other possible monomer repeat units include aromatic dials, such as 4,4'-biphenol ("BP"), hydroquinone ("HQ"), etc. and aromatic amides, such as acetaminophen ("APAP"). In certain embodiments, for example, BP, HO, and/or APAP may each constitute from about 1 mol. % to about 45 mol. %, in some embodiments from about 5 mol. % to about 40 mol. %, and in some embodiments, from about 15 mol. % to about 35 mol. % when employed.

The liquid crystalline polymers may be prepared by introducing the appropriate monomer(s) (e.g., aromatic hydroxycarboxylic acid, aromatic dicarboxylic acid, aromatic diol, aromatic amine, aromatic diamine, etc.) into a reactor vessel to initiate a polycondensation reaction. The particular conditions and steps employed in such reactions are well known, and may be described in more detail in U.S. Pat. No. 4,161,470 to Calundann; U.S. Pat. No. 5,616,680 to Linstid, III, et al.; U.S. Pat. No. 6,114,492 to Linstid, III, et al.; U.S. Pat. No. 6,514,611 to Shepherd, et al.; and WO 2004/058851 to Waggoner, which are incorporated herein in their entirety by reference thereto for all relevant purposes. The vessel employed for the reaction is not especially limited, although it is typically desired to employ one that is commonly used in reactions of high viscosity fluids. Examples of such a reaction vessel may include a stirring tank-type apparatus that has an agitator with a variably-shaped stirring blade, such as an anchor type, multistage type, spiral-ribbon type, screw shaft type, etc., or a modified shape thereof. Further examples of such a reaction vessel may include a mixing apparatus commonly used in resin kneading, such as a kneader, a roll mill, a Banbury mixer, etc.

If desired, the reaction may proceed through the acetylation of the monomers as referenced above and known the art. This may be accomplished by adding an acetylating agent (e.g., acetic anhydride) to the monomers. Acetylation is generally initiated at temperatures of about 90° C. During the initial stage of the acetylation, reflux may be employed to maintain vapor phase temperature below the point at which acetic acid byproduct and anhydride begin to distill. Temperatures during acetylation typically range from between 90° C. to 150° C., and in some embodiments, from about 110° C. to about 150° C. If reflux is used, the vapor phase temperature typically exceeds the boiling point of acetic acid, but remains low enough to retain residual acetic anhydride. For example, acetic anhydride vaporizes at temperatures of about 140° C. Thus, providing the reactor with a vapor phase reflux at a temperature of from about 110° C. to about 130° C. is particularly desirable. To ensure substantially complete reaction, an excess amount of acetic anhydride may be employed. The amount of excess anhydride will vary depending upon the particular acetylation conditions employed, including the presence or absence of reflux. The use of an excess of from about 1 to about 10 mole percent of acetic anhydride, based on the total moles of reactant hydroxyl groups present is not uncommon.

Acetylation may occur in a separate reactor vessel, or it may occur in situ within the polymerization reactor vessel. When separate reactor vessels are employed, one or more of the monomers may be introduced to the acetylation reactor and subsequently transferred to the polymerization reactor. Likewise, one or more of the monomers may also be directly introduced to the reactor vessel without undergoing pre-acetylation.

In addition to the monomers and optional acetylating agents, other components may also be included within the reaction mixture to help facilitate polymerization. For instance, a catalyst may be optionally employed, such as metal salt catalysts (e.g., magnesium acetate, tin(I) acetate, tetrabutyl titanate, lead acetate, sodium acetate, potassium acetate, etc.) and organic compound catalysts (e.g., N-methylimidazole). Such catalysts are typically used in amounts of from about 50 to about 500 parts per million based on the total weight of the recurring unit precursors. When separate reactors are employed, it is typically desired to apply the catalyst to the acetylation reactor rather than the polymerization reactor, although this is by no means a requirement.

The reaction mixture is generally heated to an elevated temperature within the polymerization reactor vessel to initiate melt polycondensation of the reactants. Polycondensation may occur, for instance, within a temperature range of from about 210° C. to about 400° C., and in some embodiments, from about 250° C. to about 350° C. For instance, one suitable technique for forming an aromatic polyester may include charging precursor monomers (e.g., 4-hydroxybenzoic acid and 2,6-hydroxynaphthoic acid) and acetic anhydride into the reactor, heating the mixture to a temperature of from about 90° C. to about 150° C. to acetylize a hydroxyl group of the monomers (e.g., forming acetoxy), and then increasing the temperature to a temperature of from about 210° C. to about 400° C. to carry out melt polycondensation. As the final polymerization temperatures are approached, volatile byproducts of the reaction (e.g., acetic acid) may also be removed so that the desired molecular weight may be readily achieved. The reaction mixture is generally subjected to agitation during polymerization to ensure good heat and mass transfer, and in turn, good material homogeneity. The rotational velocity of the agitator may vary during the course of the reaction, but typically ranges from about 10 to about 100 revolutions per minute ("rpm"), and in some embodiments, from about 20 to about 80 rpm. To build molecular weight in the melt, the polymerization reaction may also be conducted under vacuum, the application of which facilitates the removal of volatiles formed during the final stages of polycondensation. The vacuum may be created by the application of a suctional pressure, such as within the range of from about 5 to about 30 pounds per square inch ("psi"), and in some embodiments, from about 10 to about 20 psi.

Following melt polymerization, the molten polymer may be discharged from the reactor, typically through an extrusion orifice fitted with a die of desired configuration, cooled, and collected. Commonly, the melt is discharged through a perforated die to form strands that are taken up in a water bath, pelletized and dried. The resin may also be in the form of a strand, granule, or powder. While unnecessary, it should also be understood that a subsequent solid phase polymerization may be conducted to further increase molecular weight. When carrying out solid-phase polymerization on a polymer obtained by melt polymerization, it is typically desired to select a method in which the polymer obtained by melt polymerization is solidified and then pulverized to form a powdery or flake-like polymer, followed by performing solid polymerization method, such as a heat treatment in a temperature range of 200° C. to 350° C. under an inert atmosphere (e.g., nitrogen).

Regardless of the particular method employed, the resulting liquid crystalline polymer typically may have a high number average molecular weight ($M_n$) of about 2,000 grams per mole or more, in some embodiments from about 4,000 grams per mole or more, and in some embodiments, from about 5,000 to about 30,000 grams per mole. Of course, it is also possible to form polymers having a lower molecular weight, such as less than about 2,000 grams per mole, using the method of the present invention. The intrinsic viscosity of the polymer, which is generally proportional to molecular weight, may also be relatively high. For example, the intrinsic viscosity may be about 4 deciliters per gram ("dL/g") or more, in some embodiments about 5 dL/g or more, in some embodiments from about 6 to about 20 dL/g, and in some embodiments from about 7 to about 15 dL/g. Intrinsic viscosity may be determined in accordance with ISO-1628-5 using a 50/50 (v/v) mixture of pentafluorophenol and hexafluoroisopropanol, as described in more detail below.

The thermoplastic composition of the present invention is "laser activatable" in the sense that it contains an additive that is activated by a laser direct structuring ("LDS") process. In such a process, the additive is exposed to a laser that causes the release of metals. The laser thus draws the pattern of conductive elements onto the part and leaves behind a roughened surface containing embedded metal particles. These particles act as nuclei for the crystal growth during a subsequent plating process (e.g., copper plating, gold plating, nickel plating, silver plating, zinc plating, tin plating, etc.).

Laser activatable additives typically constitute from about 0.1 wt. % to about 30 wt. %, in some embodiments from about 0.5 wt. % to about 20 wt. %, and in some embodiments, from about 1 wt. % to about 10 wt. % of the thermoplastic composition. The laser activatable additive generally includes spinel crystals, which may include two or more metal oxide cluster configurations within a definable crystal formation. For example, the overall crystal formation may have the following general formula:

$$AB_2O_4$$

wherein,

A is a metal cation having a valance of 2, such as cadmium, chromium, manganese, nickel, zinc, copper, cobalt, iron, magnesium, tin, titanium, etc., as well as combinations thereof; and B is a metal cation having a valance of 3, such as chromium, iron, aluminum, nickel, manganese, tin, etc., as well as combinations thereof.

Typically, A in the formula above provides the primary cation component of a first metal oxide cluster and B provides the primary cation component of a second metal oxide cluster. These oxide clusters may have the same or different structures. In one embodiment, for example, the first metal oxide cluster has a tetrahedral structure and the second metal oxide cluster has an octahedral cluster. Regardless, the clusters may together provide a singular identifiable crystal type structure having heightened susceptibility to electromagnetic radiation, Examples of suitable spinel crystals include, for instance, $MgAl_2O_4$, $ZnAl_2O_4$, $FeAl_2O_4$, $CuFe_2O_4$, $CuCr_2O_4$, $MnFe_2O_4$, $NiFe_2O_4$, $TiFe_2O_4$, $FeCr_2O_4$, $MgCr_2O_4$, etc. Copper chromium oxide ($CuCr_2O_4$) is particularly suitable for use in the present invention and is available from Shepherd Color Co. under the designation "Shepherd Black 1GM."

To help achieve the desired dielectric properties, the thermoplastic composition of the present invention also contains a dielectric material. The dielectric material may include ceramic particles that exhibit a linear response of electrical charge (or polarization) versus voltage. These materials may exhibit a total reversible polarization of charge within the crystal structure after the applied electrical field is removed. Suitable ceramic particles for this purpose may include, for instance, ferroelectric and/or paraelectric materials. Examples of suitable ferroelectric materials include, for instance, barium titanate ($BaTiO_3$), strontium titanate ($SrTiO_3$), calcium titanate ($CaTiO_3$), magnesium titanate ($MgTiO_3$), strontium barium titanate ($SrBaTi_2O_6$), sodium barium niobate ($NaBa_2Nb_5O_{15}$), potassium barium niobate ($KBa_2Nb_5O_{15}$), etc., as well as combinations thereof. Examples of suitable paraelectric materials likewise include, for instance, titanium dioxide ($TiO_2$), tantalum pentoxide ($Ta_2O_5$), hafnium dioxide ($HfO_2$), niobium pentoxide ($Nb_2O_5$), alumina ($Al_2O_3$), etc., as well as combinations thereof. Particularly suitable dielectric materials are those that are titanium-based, such as $TiO_2$, $BaTiO_3$, $SrTiO_3$, $CaTiO_3$, $MgTiO_3$, and $BaSrTi_2O_6$. The shape of the ceramic particles are not particularly limited and may include fine powders, fibers, plates, etc. Desirably, the ceramic particles are in the form of a fine powder having an average size of from about 0.01 to about 100 micrometers, and in some embodiments, from about 0.10 to about 20 micrometers.

In certain embodiments, the ceramic particles may contain a surface treatment that helps enhance their compatibility with the liquid crystalline polymer. The surface treatment may, for instance, contain an organophosphorous compound, such as an organoacid phosphate, organopyrophosphate, organopolyphosphate, or an organometaphosphate, or mixtures thereof. Such treatments are described in more detail, for instance, in U.S. Pat. Nos. 6,825,251 and 7,259,195, both to El-Shoubary, et al.

In one embodiment, for instance, the treatment may include an organoacid phosphate, which may be formed from the reaction of organic alcohols and $P_2O_5$ and/or phosphoric acid. The organic alcohols may have hydrocarbon groups from about 2 to about 22 carbon atoms. These hydrocarbons may be linear or branched, substituted or unsubstituted, and saturated or unsaturated. Some examples of organic alcohols may include, for instance, ethanol, propanol, butanol, isobutanol, tertiary butanol, pentanol, hexanol, heptanol, octanol, isooctanol, 2-ethylhexanol, decanol, dodecanol, etc. In yet another embodiment, the treatment may include an organophosphoric acid compound that is either an organopyrophosphate or organopolyphosphate. These compounds may be represented by the formula: $R'_n—P_{(n-2)}O_{4+[3(n-3)]}$, wherein n is 4 to 14 and R' is an organic group having from 2 to 22 carbon atoms or hydrogen. Examples of organopyrophosphate acid compounds and organopolyphosphate acid compounds include, for instance, caprylpyrophosphate, 2-ethylhexylpyrophosphate, dihexylpyrophosphate, dihexylammoniumpyrophosphate, dioctylpyrophosphate, diisooctylpyrophosphate, dioctyltriethanolaminepyrophosphate, bis(2-ethylhexyl)pyrophosphate, bis(2-ethylhexyl) sodium pyrophosphate, tetraethylpyrophosphate, tetrabuytlpyrophosphate, tetrahexylpyrophosphate, tetraoctylpyrophosphate, pentahexyltripolyphosphate, pentaoctyltripolyphosphate, tetrahexyl sodium tripolyphosphate, tetrahexylammoniumtripolyphosphate, pentahexyl sodium tetrapolyphosphate, trioctyl sodium tetrapolyphosphate, trioctyl potassium tetrapolyphosphate, hexabutyltetrapolyphosphate, hexahexyltetrapolyphosphate and hexaoctyltetrapolyphosphate.

The organophosphorous compound may also be a phosphorylated polyene, such as described in U.S. Pat. No. 4,209,430 to Weber. As used herein, the term "phosphorylation" generally refers to the addition of a phosphoryl group to the olefinic unsaturation (or its equivalent) of an aliphatic polyunsaturated compound ("polyene"). The "polyene" includes (poly)unsaturated olefins, optionally in admixture with a monounsaturated olefin and/or in admixture with a saturated olefin. Suitable olefins can be linear or branched acyclic structures or can be cyclic structures. Additionally, substitution is permitted on the polyene such as, for example, carboxyl, carboxylic acid ester, halide, ether, sulfate, aromatic, amino, etc., and mixtures thereof. Particularly suitable are fatty acids having a chain length of at least $C_{10}$ and, in some embodiments, $C_{18}$ and higher (e.g. $C_{18}$ to $C_{28}$), such as linoleic acid, linolenic acid, oleic acid, stearic acid, etc., as well as esters and mixtures thereof.

In addition to, or in lieu of the ceramic particles described above, carbon particles (e.g., graphite, carbon black, etc.) may also be employed as a dielectric material. Due to their conductivity, it is typically desired to control the presence of such carbon particles within a certain range to minimize the impact on the dissipation factor of the composition. For example, the carbon particles typically constitute about 8 wt. % or less, in some embodiments from about 0.1 wt. % to about 5 wt. %, and in some embodiments, from about 0.5 wt. % to about 3 wt. % of the composition. To the contrary, the amount of ceramic particles in the thermoplastic composition typically ranges from about 1 wt. % to about 50 wt. %, in some embodiments from about 5 wt. % to about 40 wt. %, and in some embodiments from about 10 wt. % to about 30 wt. %. The total amount of the dielectric material will likewise typically range from about 1 wt. % to about 50 wt. %, in some embodiments from about 5 wt. % to about 40 wt. %, and in some embodiments, from about 10 wt. % to about 30 wt. % of the composition.

The resulting thermoplastic composition thus has a relatively high dielectric constant. For example, the average dielectric constant of the composition may be greater than about 4.4, in some embodiments from about 4.4 to about 20.0, in some embodiments from about 4.8 to about 15, and in some embodiments, from about 5.0 to about 9.0, as determined by the split post resonator method at a frequency of 2 GHz. Such a high dielectric constant can facilitate the ability to form a thin substrate and also allow multiple conductive elements (e.g., antennae) to be employed that operate simultaneously with only a minimal level of electrical interference. The dissipation factor, a measure of the loss rate of energy, is also relatively low, such as about 0.0150 or less, in some embodiments about 0.0060 or less, in some embodiments from about 0.0001 to about 0.0055, and in some embodiments, from about 0.0002 to about 0.0050, as determined by the split post resonator method at a frequency of 2 GHz.

Conventionally, it was believed that thermoplastic compositions that are laser activatable and possess a high dielectric constant would not also possess sufficiently good thermal, mechanical properties and ease in processing (i.e., low viscosity) to enable their use in certain types of applications. Contrary to conventional thought, however, the liquid crystalline thermoplastic composition of the present invention has been found to possess both excellent thermal, mechanical properties and processibility. The melting temperature of the composition may, for instance, be from about 250° C. to about 440° C., in some embodiments from about 270° C. to about 400° C., and in some embodiments, from about 300° C. to about 360° C. The melting temperature may be determined as is well known in the art using differential scanning calorimetry ("DSC"), such as determined by ISO Test No. 11357.

Even at such melting temperatures, the present inventor has discovered that the ratio of the deflection temperature under load ("DTUL"), a measure of short term heat resistance, to the melting temperature may still remain relatively high. For example, the ratio may range from about 0.67 to about 1.00, in some embodiments from about 0.68 to about 0.95, and in some embodiments, from about 0.70 to about 0.85. The specific DTUL values may, for instance, range from about 200° C. to about 350° C., in some embodiments from about 210° C. to about 320° C., and in some embodiments, from about 230° C. to about 290° C. Such high DTUL values can, among other things, allow the use of high speed and reliable surface mounting processes for mating the structure with other components of the electrical component.

The liquid crystalline thermoplastic composition may also possess a high impact strength, which is useful when forming thin substrates. The composition may, for instance, possess a Charpy notched impact strength greater than about 6 kJ/m², in some embodiments from about 8 to about 50 kJ/m², in some embodiments from about 10 to about 45 kJ/m², and in some embodiments, from about 15 to about 40 kJ/m², measured at 23° C. according to ISO Test No. 179-1) (technically equivalent to ASTM D256, Method B). The tensile and flexural mechanical properties of the composition are also good. For example, the thermoplastic composition may exhibit a tensile strength of from about 20 to about 500 MPa, in some embodiments from about 50 to about 400 MPa, and in some embodiments, from about 100 to about 350 MPa; a tensile break strain of about 0.5% or more, in some embodiments from about 0.6% to about 10%, and in some embodiments, from about 0.8% to about 3.5%; and/or a tensile modulus of from about 5,000 MPa o about 20,000 MPa, in some embodiments from about 8,000 MPa to about 20,000 MPa, and in some embodiments, from about 10,000 MPa to about 20,000 MPa. The tensile properties may be determined in accordance with ISO Test No. 527 (technically equivalent to ASTM D638) at 23° C. The thermoplastic composition may also exhibit a flexural strength of from about 20 to about 500 MPa, in some embodiments from about 50 to about 400 MPa, and in some embodiments, from about 100 to about 350 MPa and/or a flexural modulus of from about 5,000 MPa o about 20,000 MPa, in some embodiments from about 8,000 MPa to about 20,000 MPa, and in some embodiments, from about 10,000 MPa to about 15,000 MPa. The flexural properties may be determined in accordance with ISO Test No. 178 (technically equivalent to ASTM D790) at 23° C.

The composition may also exhibit improved flame resistance performance, even in the absence of conventional flame retardants. The flame resistance of the composition may, for instance, be determined in accordance the procedure of Underwriter's Laboratory Bulletin 94 entitled "Tests for Flammability of Plastic Materials, UL94". Several ratings can be applied based on the time to extinguish (total flame time) and ability to resist dripping as described in more detail below. According to this procedure, for example, a molded part formed from the composition of the present invention may achieve a V0 rating, which means that the part has a total flame time of about 50 seconds or less, determined at a relatively low thickness (e.g., 0.25 mm or 0.8 mm). To achieve a V0 rating, the part may also have a total number of drips of burning particles that ignite cotton of 0. For example, when exposed to an open flame, a molded part formed from the composition of the present invention may exhibit a total flame time of about 50 seconds or less, in some embodiments about 45 seconds or less, and in some embodiments, from about 1 to about 40 seconds. Furthermore, the total number of drips of burning particles produced during the UL94 test may be 3 or less, in some embodiments 2 or less, and in some embodiments, 1 or less (e.g., 0). Such testing may be performed after conditioning for 48 hours at 23° C. and 50% relative humidity and/or after 7 days at 70° C.

The ability to form a thermoplastic composition with the properties noted above can be facilitated by the use of a unique combination of different components in carefully controlled amounts. For example, to achieve the desired dielectric properties and to render the composition suitable for laser direct structuring, the combined amount of the dielectric material and the laser activatable additive may be within a range of from about 5 wt. % to about 50 wt. %, in some embodiments from about 10 wt. % to about 45 wt. %, and in some embodiments, from about 15 wt. % to about 40 wt. % of the thermoplastic composition. While achieving the desired electrical properties, such materials can nevertheless have an adverse impact on the mechanical properties of the composition.

In this regard, the present inventor has discovered that a fibrous filler can also be employed in the thermoplastic composition to improve the thermal and mechanical properties of the composition without having a significant impact on electrical performance. The fibrous filler typically includes fibers having a high degree of tensile strength relative to their mass. For example, the ultimate tensile strength of the fibers (determined in accordance with ASTM D2101) is typically from about 1,000 to about 15,000 Megapascals ("MPa"), in some embodiments from about 2,000 MPa to about 10,000 MPa, and in some embodiments, from about 3,000 MPa to about 6,000 MPa. To help maintain the desired dielectric properties, such high strength fibers may be formed from materials that are generally insulative in nature, such as glass, ceramics (e.g., alumina or silica), aramids (e.g., Kevlar® marketed by E. I. duPont de Nemours, Wilmington, Del.), polyolefins, polyesters, titanium acids (e.g., titanium acid potassium available from TISMO), etc. Glass fibers are particularly suitable, such as E-glass, A-glass, C-glass, O-glass, AR-glass, R-glass, S1-glass, S2-glass, etc.

Further, although the fibers employed in the fibrous filler may have a variety of different sizes, the present inventor has surprisingly discovered that fibers having a certain aspect ratio can help improve the mechanical properties of the resulting thermoplastic composition. That is, fibers having an aspect ratio (average length divided by nominal diameter) of from about 5 to about 50, in some embodiments from about 6 to about 40, and in some embodiments, from about 8 to about 25 are particularly beneficial. Such fibers may, for instance, have a weight average length of from about 100 to about 800 micrometers, in some embodiments from about 120 to about 500 micrometers, in some embodiments, from about 150 to about 350 micrometers, and in some embodiments, from about 200 to about 300 micrometers. The fibers may likewise have a nominal diameter of about 6 to about 35 micrometers, and in some embodiments, from about 9 to about 18 micrometers.

The relative amount of the fibrous filler is also selectively controlled to help achieve the desired mechanical and thermal properties without adversely impacting other properties of the composition, such as its flowability and dielectric properties, etc. For example, the fibrous filler is typically employed in a sufficient amount so that the weight ratio of the fibrous filler to the combined amounts of the dielectric and laser activatable materials is from about 0.4 to about 2.0, in some embodiments from about 0.5 to about 1.5, and in some embodiments from about 0.6 to about 1.0. The fibrous filler may, for instance, constitute from about 5 wt. % to about 50 wt. %, in some embodiments from about 10 wt. % to about 40 wt. %, and in some embodiments, from about 15 wt. % to about 35 wt. % of the thermoplastic composition.

In addition to the components noted above, still other additives that can be included in the composition may include, for instance, antimicrobials, pigments, antioxidants, stabilizers, surfactants, waxes, flow promoters, solid solvents, and other materials added to enhance properties and processibility. For example, additional fillers may also be employed in the present invention to impart a variety of different properties to the thermoplastic composition. Examples of additional fillers may include, for instance, mineral fillers, such as calcium carbonate, highly dispersible silicic acid, alumina, aluminum hydroxide (alumina trihydrate), talc powder, mica, wollastonite, quartz sand, silica sand, etc.

The materials used to form the thermoplastic composition may be combined together using any of a variety of different techniques as is known in the art. In one particular embodiment, for example, the liquid crystalline polymer, dielectric material, laser activatable additive, fibrous filler, and other optional additives are melt processed as a mixture within an extruder to form the thermoplastic composition. The mixture may be melt-kneaded in a single-screw or multi-screw extruder at a temperature of from about 250° C. to about 450° C. In one embodiment, the mixture may be melt processed in an extruder that includes multiple temperature zones. The temperature of individual zones are typically set within about −60° C. to about 25° C. relative to the melting temperature of the liquid crystalline polymer. By way of example, the mixture may be melt processed using a twin screw extruder such as a Leistritz 18-mm co-rotating fully intermeshing twin screw extruder. A general purpose screw design can be used to melt process the mixture. In one embodiment, the mixture including all of the components may be fed to the feed throat in the first barrel by means of a volumetric feeder. In another embodiment, different components may be added at different addition points in the extruder, as is known. For example, the liquid crystalline polymer may be applied at the feed throat, and certain additives (e.g., dielectric material, laser activatable additive, and fibrous filler) may be supplied at the same or different temperature zone located downstream therefrom. Regardless, the resulting mixture can be melted and mixed then extruded through a die. The extruded thermoplastic composition can then be quenched in a water bath to solidify and granulated in a pelletizer followed by drying.

The melt viscosity of the resulting composition is generally low enough that it can readily flow into the cavity of a mold to form the small-sized circuit substrate. For example, in one particular embodiment, the thermoplastic composition may have a melt viscosity of from about 5 to about 100 Pa-s, in some embodiments from about 10 to about 80 Pa-s, and in some embodiments, from about 15 to about 75 Pa-s, determined at a shear rate of 1000 seconds$^{-1}$. Melt viscosity may be determined in accordance with ASTM Test No. 1238-70 at a temperature of 350° C.

Once formed, the thermoplastic composition may be molded into the desired shape of a substrate. Typically, the shaped parts are molded using a one-component injection molding process in which dried and preheated plastic granules are injected into the mold. As indicated above, conductive elements may then be formed on the substrate using a laser direct structuring process ("LDS"). Activation with a laser causes a physio-chemical reaction in which the spinel crystals are cracked open to release metal atoms. These metal atoms can act as a nuclei for metallization (e.g., reductive copper coating). The laser also creates a microscopically irregular surface and ablates the polymer matrix, creating numerous microscopic pits and undercuts in which the copper can be anchored during metallization. The resulting part may, for example, be a molded interconnect device ("MID") or part in that it contains integrated electronic circuit conductive elements. One example of such a part is one in which the conductive elements form antennas of a variety of different types, such as antennae with resonating elements that are formed from patch antenna structures, inverted-F antenna structures, closed and open slot antenna structures, loop antenna structures, monopoles, dipoles, planar inverted-F antenna structures, hybrids of these designs, etc. Due to the high dielectric constant of the thermoplastic composition of the present invention, the size of the antenna structure can be relatively small. The size ("L") of the antenna structure may, for instance, be approximated by the following equation:

$$L = v_0/(2f_r\sqrt{\in_r})$$

$v_0$=speed of light in free space
$f_r$=frequency of operation
$\in_r$=dielectric constant (or Dk) of substrate Thus, because the antenna size "L" is inversely proportional to $\sqrt{\in_r}$, a higher dielectric constant results in a smaller antenna structure.

Figure 2:
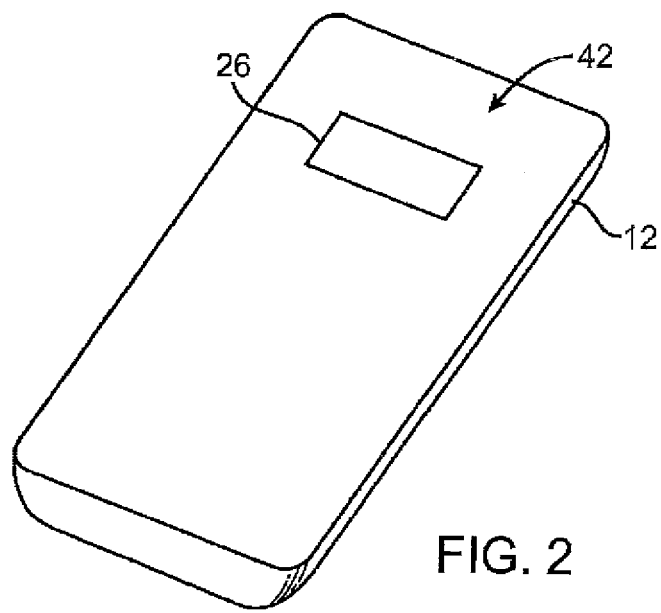

One particularly suitable electronic component is shown in FIGS. 1-2 is a handheld device 10 with cellular telephone capabilities. As shown in FIG. 1, the device 10 may have a housing 12 formed from plastic, metal, other suitable dielectric materials, other suitable conductive materials, or combinations of such materials. A display 14 may be provided on a front surface of the device 10, such as a touch screen display. The device 10 may also have a speaker port 40 and other input-output ports. One or more buttons 38 and other user input devices may be used to gather user input. As shown in FIG. 2, an antenna structure 26 is also provided on a rear surface 42 of device 10, although it should be understood that the antenna structure can generally be positioned at any desired location of the device. The antenna structure may be electrically connected to other components within the electronic device using any of a variety of known techniques.

Figure 3:
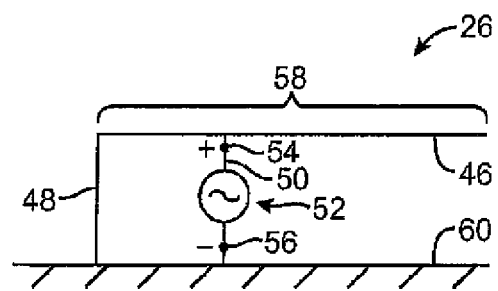
FIG. 3 is a top view of an illustrative inverted-F antenna resonating element for one embodiment of an antenna structure.

Referring again to FIGS. 1-2, for example, the housing 12 or a part of housing 12 may serve as a conductive ground plane for the antenna structure 26. This is more particularly illustrated in FIG. 3, which shows the antenna structure 26 as being fed by a radio-frequency source 52 at a positive antenna feed terminal 54 and a ground antenna feed terminal 56. The positive antenna feed terminal 54 may be coupled to an antenna resonating element 58, and the ground antenna feed terminal 56 may be coupled to a ground element 60. The resonating element 58 may have a main arm 46 and a shorting branch 48 that connects main arm 46 to ground 60.

Figure 4:
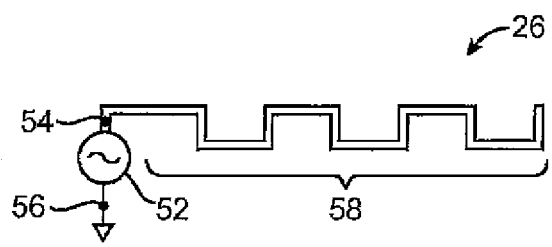
FIG. 4 is a top view of an illustrative monopole antenna resonating element for one embodiment of an antenna structure.
Figure 5:
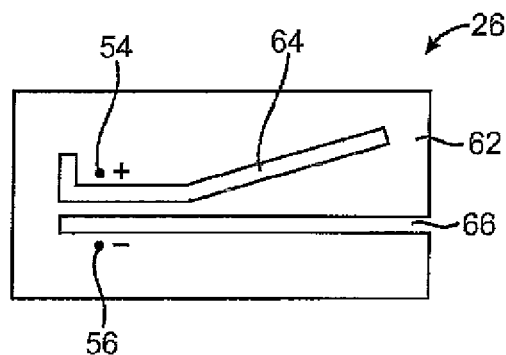
FIG. 5 is a top view of an illustrative slot antenna resonating element for one embodiment of an antenna structure.
Figure 6:
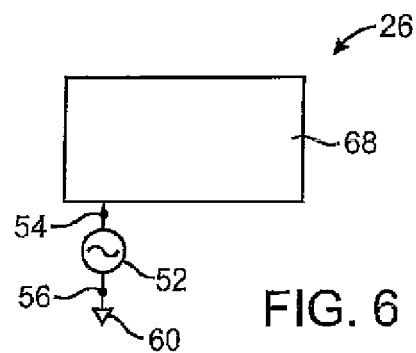
FIG. 6 is a top view of an illustrative patch antenna resonating element for one embodiment of an antenna structure.
Figure 7:
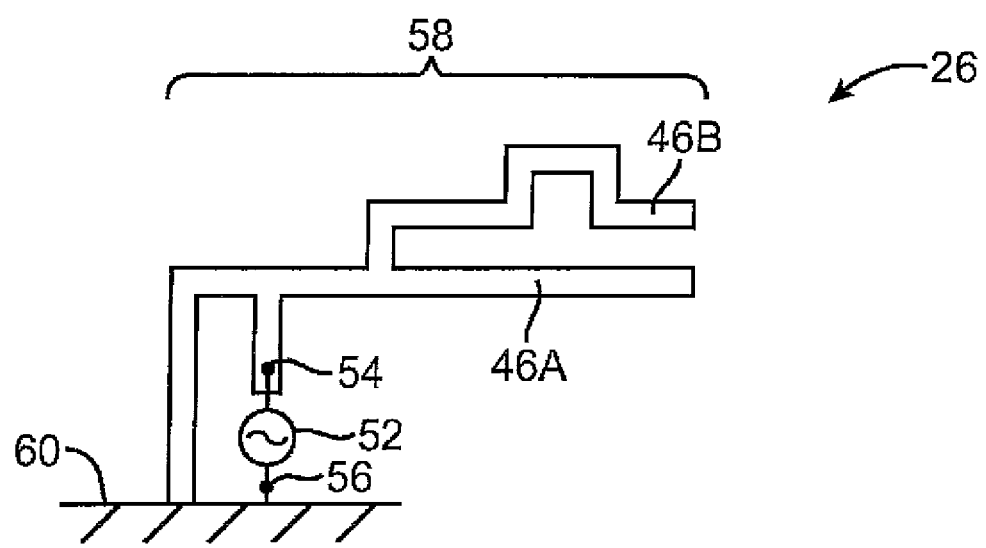
FIG. 7 is a top view of an illustrative multibranch inverted-F antenna resonating element for one embodiment of an antenna structure.

Various other configurations for electrically connecting the antenna structure are also contemplated. In FIG. 4, for instance, the antenna structure is based on a monopole antenna configuration and the resonating element 58 has a meandering serpentine path shape. In such embodiments, the feed terminal 54 may be connected to one end of resonating element 58, and the ground feed terminal 56 may be coupled to housing 12 or another suitable ground plane element. In another embodiment as shown in FIG. 5, conductive antenna structures 62 are configured to define a closed slot 64 and an open slot 66. The antenna formed from structures 62 may be fed using positive antenna feed terminal 54 and ground antenna feed terminal 56. In this type of arrangement, slots 64 and 66 serve as antenna resonating elements for the antenna structure 26. The sizes of the slots 64 and 66 may be configured so that the antenna structure 26 operates in desired communications bands (e.g., 2.4 GHz and 5 GHz, etc.). Another possible configuration for the antenna structure antenna 26 is shown in FIG. 6. In this embodiment, the antenna structure 26 has a patch antenna resonating element 68 and may be fed using positive antenna feed terminal 54 and ground antenna feed terminal 56. The ground 60 may be associated with housing 12 or other suitable ground plane elements in device 10. FIG. 7 shows yet another illustrative configuration that may be used for the antenna structures of the antenna structure 26. As shown, antenna resonating element 58 has two main arms 46A and 46B. The arm 46A is shorter than the arm 46B and is therefore associated with higher frequencies of operation than the arm 46A. By using two or more separate resonating element structures of different sizes, the antenna resonating element 58 can be configured to cover a wider bandwidth or more than a single communications band of interest.

Due to its unique properties, the molded part of the present invention (e.g., antenna structure) may be employed in a wide variety of different electronic components. As an example, the molded part may be formed in electronic components, such as desktop computers, portable computers, handheld electronic devices, etc. In one suitable configuration, the part is formed in the housing of a relatively compact portable electronic component in which the available interior space is relatively small. Examples of suitable portable electronic components include cellular telephones, laptop computers, small portable computers (e.g., ultraportable computers, netbook computers, and tablet computers), wrist-watch devices, pendant devices, headphone and earpiece devices, media players with wireless communications capabilities, handheld computers (also sometimes called personal digital assistants), remote controllers, global positioning system (GPS) devices, handheld gaming devices, etc. The part could also be integrated with other components such as camera module, speaker or battery cover of a handheld device.

Apart from those referenced above, the molded device of the present invention may also be employed in a wide variety of other components, such as implantable medical devices. For example, the implantable medical device may be an active device, such as neurostimulators that are configured to provide a stimulation signal (e.g., therapeutic signal) to the central nervous system and/or peripheral nervous system, cardiac pacemakers or defibrillators, etc. Electrical neurostimulation may be provided by implanting an electrical device underneath the patient's skin and delivering an electrical signal to a nerve, such as a cranial nerve. The electrical signal may be applied by an implantable medical device that is implanted within the patient's body. In another alternative embodiment, the signal may be generated by an external pulse generator outside the patient's body, coupled by an RF or wireless link to an implanted electrode.

The present invention may be better understood with reference to the following examples.

TEST METHODS

Melt Viscosity:

The melt viscosity (Pa-s) was determined in accordance with ISO Test No. 11443 at 350° C. and at a shear rate of 1000 s$^{-1}$ using a Dynisco 7001 capillary rheometer. The rheometer orifice (die) had a diameter of 1 mm, length of 20 mm, L/D ratio of 20.1, and an entrance angle of 180°. The diameter of the barrel was 9.55 mm±0.005 mm and the length of the rod was 233.4 mm.

Melting Temperature:

The melting temperature ("Tm") was determined by differential scanning calorimetry ("DSC") as is known in the art. The melting temperature is the differential scanning calorimetry (DSC) peak melt temperature as determined by ISO Test No. 11357. Under the DSC procedure, samples were heated and cooled at 20° C. per minute as stated in ISO Standard 10350 using DSC measurements conducted on a TA Q2000 Instrument.

Deflection Under Load Temperature ("DTUL"):

The deflection under load temperature was determined in accordance with ISO Test No. 75-2 (technically equivalent to ASTM D648-07). More particularly, a test strip sample having a length of 80 mm, thickness of 10 mm, and width of 4 mm was subjected to an edgewise three-point bending test in which the specified load (maximum outer fibers stress) was 1.8 Megapascals. The specimen was lowered into a silicone oil bath where the temperature is raised at 2° C. per minute until it deflects 0.25 mm (0.32 mm for ISO Test No. 75-2).

Tensile Modulus, Tensile Stress, and Tensile Elongation:

Tensile properties are tested according to ISO Test No. 527 (technically equivalent to ASTM D638). Modulus and strength measurements are made on the same test strip sample having a length of 80 mm, thickness of 10 mm, and width of 4 mm. The testing temperature is 23° C., and the testing speeds are 1 or 5 mm/min.

Flexural Modulus, Flexural Stress, and Flexural Strain:

Flexural properties are tested according to ISO Test No. 178 (technically equivalent to ASTM D790). This test is performed on a 64 mm support span. Tests are run on the center portions of uncut ISO 3167 multi-purpose bars. The testing temperature is 23° C. and the testing speed is 2 mm/min.

Notched Charpy Impact Strength:

Notched Charpy properties are tested according to ISO Test No. ISO 179-1) (technically equivalent to ASTM D256, Method B). This test is run using a Type A notch (0.25 mm base radius) and Type 1 specimen size (length of 80 mm, width of 10 mm, and thickness of 4 mm). Specimens are cut from the center of a multi-purpose bar using a single tooth milling machine. The testing temperature is 23° C.

Dielectric Constant ("Dk") and Dissipation Factor ("Df"):

The dielectric constant (or relative static permittivity) and dissipation factor are determined using a known split-post dielectric resonator technique, such as described in Baker-Jarvis, et al., *IEEE Trans. on Dielectric and Electrical Insulation,* 5(4), p. 571 (1998) and Krupka, et al., *Proc. 7$^{th}$ International Conference on Dielectric Materials: Measurements and Applications, IEEE Conference Publication No,* 430 (September 1996). More particularly, a plaque sample having a size of 80 mm×80 mm×1 mm was inserted between two fixed dielectric resonators. The resonator measured the permittivity component in the plane of the specimen. Five (5) samples are tested and the average value is recorded. The split-post resonator can be used to make dielectric measurements in the low gigahertz region, such as 1 GHz from 2 GHz.

UL94:

A specimen is supported in a vertical position and a flame is applied to the bottom of the specimen. The flame is applied for ten (10) seconds and then removed until flaming stops, at which time the flame is reapplied for another ten (10) seconds and then removed. Two (2) sets of five (5) specimens are tested. The sample size is a length of 125 mm, width of 13 mm, and a certain thickness of (e.g., 1.5 mm, 0.8 mm, 0.25 mm, etc.). The two sets are conditioned before and after aging. For unaged testing, each thickness is tested after conditioning for 48 hours at 23° C. and 50% relative humidity. For aged testing, five (5) samples of each thickness are tested after conditioning for 7 days at 70° C. The lowest thickness for which a V0 rating can be achieved, as described below, may be recorded.

| Vertical Ratings | Requirements |
|---|---|
| V-0 | Specimens must not burn with flaming combustion for more than 10 seconds after either test flame application. Total flaming combustion time must not exceed 50 seconds for each set of 5 specimens. Specimens must not burn with flaming or glowing combustion up to the specimen holding clamp. Specimens must not drip flaming particles that ignite the cotton. No specimen can have glowing combustion remain for longer than 30 seconds after removal of the test flame. |
| V-1 | Specimens must not burn with flaming combustion for more than 30 seconds after either test flame application. Total flaming combustion time must not exceed 250 seconds for each set of 5 specimens. Specimens must not burn with flaming or glowing combustion up to the specimen holding clamp. Specimens must not drip flaming particles that ignite the cotton. No specimen can have glowing combustion remain for longer than 60 seconds after removal of the test flame. |
| V-2 | Specimens must not burn with flaming combustion for more than 30 seconds after either test flame application. Total flaming combustion time must not exceed 250 seconds for each set of 5 specimens. Specimens must not burn with flaming or glowing combustion up to the specimen holding clamp. Specimens can drip flaming particles that ignite the cotton. No specimen can have glowing combustion remain for longer than 60 seconds after removal of the test flame. |

EXAMPLE 1

A thermoplastic composition is formed from 55.5 wt. % of a liquid crystalline polymer, 38.5 wt. % talc, and 6.0 wt. % of a copper chromite filler ($CuCr_2O_4$) available from Shepherd Color Co. under the designation Shepherd 1GM. The liquid crystalline polymer is formed from 4-hydroxybenzoic acid ("HBA"), 2,6-hydroxynaphthoic acid ("HNA"), terephthalic acid ("TA"), 4,4'-biphenol ("BP"), and acetaminophen ("APAP"), such as described in U.S. Pat. No. 5,508,374 to Lee, et al. The HNA content is 5 mol. %.

EXAMPLE 2

A thermoplastic composition is formed from 59.0 wt. % of a liquid crystalline polymer, 15.0 wt. % talc, 20.0 wt. % glass fibers and 6.0 wt % of a copper chromite filler (Shepherd IGM). The glass fibers are Advantex™ E glass, which are available from Owens Corning Vetrotex. The liquid crystalline polymer is the same polymer employed in Example 1. After formation of the composition, the weight average length of the glass fibers was tested and determined to be 340 micrometers (1 std. deviation of 160 micrometers).

EXAMPLE 3

A thermoplastic composition is formed from 59.0 wt. % of a liquid crystalline polymer, 15.0 wt. % talc, 20.0 wt. % milled glass fibers having a weight average fiber length of from 50 to 80 μm, and 6.0 wt. % of a copper chromite filler (Shepherd IGM). The liquid crystalline polymer is the same polymer employed in Example 1.

EXAMPLE 4

A thermoplastic composition is formed from 59.0 wt. % of a liquid crystalline polymer, 15 wt. % rutile titanium dioxide (Tiona™ RCL-188 from Millennium), 20.0 wt. % Advantex™ E glass fibers, and 6.0 wt. % of a copper chromite filler (Shepherd IGM). The liquid crystalline polymer is the same polymer employed in Example 1. After formation of the composition, the weight average length of the glass fibers was tested and determined to be 270 micrometers (1 std. deviation of 130 micrometers).

EXAMPLE 5

A thermoplastic composition is formed from 44.0 wt. % of a first liquid crystalline polymer, 20 wt. % of masterbatch containing a second liquid crystalline polymer (14 wt. % of the total composition) and a copper chromite filler (Shepherd IGM, 6.0 wt. % of the total composition), 15 wt. % rutile titanium dioxide (Tiona™ RCL-188 from Millennium), 20.0 wt. % Advantex™ E glass fibers, and 1.0 wt. % alumina trihydrate. The first liquid crystalline polymer is formed from 4-hydroxybenzoic acid ("HBA"), napthanlene-2,6-dicarboxylic acid ("NDA"), terephthalic acid, and hydroquinone ("HQ"), such as described in U.S. Pat. No. 5,969,083 to Long, et al. The NDA content is 20 mol. %. The second liquid crystalline polymer is the same as employed in Example 1. After formation of the composition, the weight average length of the glass fibers was tested and determined to be 300 micrometers (1 std. deviation of 150 micrometers).

EXAMPLE 6

A thermoplastic composition is formed from 34.0 wt. % of a first liquid crystalline polymer, 20 wt. % of masterbatch containing a second liquid crystalline polymer (14 wt. % of the composition) and a copper chromite filler (Shepherd IGM, 6.0 wt. % of the composition), 25 wt. % rutile titanium dioxide (Tiona™ RCL-188 from Millennium), 20.0 wt. % Advantex™ E glass fibers, and 1.0 wt. % alumina trihydrate. The first and the second liquid crystalline polymers are the same as employed in Example 5. After formation of the composition, the weight average length of the glass fibers was tested and determined to be 310 micrometers (1 std. deviation of 120 micrometers).

The thermal and mechanical properties of the polymers of Examples 1-6 were tested as described above. The results are set forth below.

| Property | | 1 | 2 | 3 | 4 | 5 | 6 |
|---|---|---|---|---|---|---|---|
| Melt Viscosity (Pa-s), at 350° C. for Ex. 1-4 and 340° C. for Ex. 5-6 | | 45.0 | 47.5 | 48.2 | 51.1 | 29.4 | 61.6 |
| Tm (° C.) | | 334 | 335 | 334 | 335 | 320 | 320 |
| DTUL (° C.) | | 223 | 253 | 224 | 251 | 257 | 256 |
| Ratio of DTUL to Tm | | 0.667 | 0.755 | 0.671 | 0.723 | 0.788 | 0.773 |
| Tensile Strength (MPa) | | 109 | 134 | 117 | 134 | 134 | 108 |
| Tensile Break Strain (%) | | 3.3 | 1.7 | 3.5 | 2.0 | 1.7 | 1.1 |
| Tensile Modulus (MPa) | | 9,749 | 12,427 | 10,030 | 13,615 | 12,427 | 12,954 |
| Flex Strength (MPa) | | 129 | 196 | 143 | 188 | 180 | 163 |
| Flex Modulus (MPa) | | 11,009 | 14,735 | 11,162 | 13,614 | 12,070 | 12,658 |
| Notched Charpy Impact Strength (kJ/m$^2$) | | 6 | 22 | 10 | 24 | 10 | 6 |
| Dielectric Constant (Dk) | Average | 4.303 | 4.347 | 4.218 | 5.160 | 5.036 | 5.858 |
| | 95% Confidence Level | 4.192 to 4.414 | 4.236 to 4.458 | 4.109 to 4.327 | 5.026 to 5.294 | 4.904 to 5.168 | 5.690 to 6.026 |
| Dissipation Factor (Df) | Average | 0.0033 | 0.0051 | 0.0047 | 0.0054 | 0.0044 | 0.0044 |
| | 95% Confidence Level | 0.00325 to 0.00335 | 0.0049 to 0.0053 | 0.0046 to 0.0048 | 0.0053 to 0.0055 | 0.0043 to 0.0045 | 0.0043 to 0.0045 |

EXAMPLES 7-10

Thermoplastic compositions are formed from a LDS polymer concentrate, liquid crystalline polymer, rutile titanium dioxide (Tiona™ RCL-4 from Millennium), and Advantex™ E glass fibers. The polymer concentrate contained 30.0 wt. % of a copper chromite filler (Shepherd IGM) and 70 wt. % of a liquid crystalline polymer. In some cases, a polymer concentrate containing 25 wt. % graphite and 75 wt. % of a liquid crystalline polymer are also employed. The liquid crystalline polymers employed in the composition are the same as the polymer employed in Example 1. The constituents of each Example are set forth below in more detail.

|  | Example 7 | Example 8 | Example 9 | Example 10 |
|---|---|---|---|---|
| LCP | 58.0 | 47.5 | 55.5 | 53.0 |
| Glass Fibers | 20.0 | 20.0 | 20.0 | 20.0 |
| Shepherd 1GM | 6.0 | 6.0 | 6.0 | 6.0 |
| TiO$_2$ | 15.0 | 25.0 | 15.0 | 15.0 |
| Carbon Black | 1.0 | 1.5 | 1.0 | 1.0 |
| Graphite | — | — | 2.5 | 5.0 |

After formation of the composition, various thermal and mechanical properties were tested as described above. The results are set forth below.

| Property | Example 7 | Example 8 | Example 9 | Example 10 |
|---|---|---|---|---|
| Melt Viscosity (Pa-s) at 350° C. | 47.5 | 56.2 | 48.3 | 46.7 |
| DTUL (° C.) | 257 | 255 | 252 | 254 |
| Tensile Strength (MPa) | 155 | 144 | 150 | 155 |
| Strain at Break (%) | 1.8 | 1.5 | 1.7 | 1.7 |
| Tensile Modulus (MPa) | 15,096 | 15,568 | 14,978 | 15,372 |
| Notched Charpy Impact Strength (kJ/m$^2$) | 34 | 18 | 25 | 31 |
| Avg. Dielectric Constant (Dk) | 5.2 | 6.2 | 7.9 | >10 |
| Avg. Dissipation Factor (Df) | 0.006 | 0.009 | 0.011 | — |

EXAMPLE 11

A thermoplastic composition is formed from 58.0 wt. % of a liquid crystalline polymer (containing 0.5 wt. % alumina trihydrate), 15 wt. % rutile titanium dioxide (Ti-pure™ R-104 from DuPont), 20.0 wt. % Advantex™ E glass fibers, 6.0 wt. % of a copper chromite filler (Shepherd IGM), and 1.0 wt. % carbon black. The liquid crystalline polymer is the same as employed in Example 5.

EXAMPLE 12

A thermoplastic composition is formed from 47.5 wt. % of a liquid crystalline polymer (containing 0.5 wt. % alumina trihydrate), 25 wt. % rutile titanium dioxide (Ti-pure™ R-104 from DuPont), 20.0 wt. % Advantex™ E glass fibers, 6.0 wt. % of a copper chromite filler (Shepherd IGM), and 1.5 wt. % carbon black. The liquid crystalline polymer is the same as employed in Example 5.

The thermal and mechanical properties of the polymers of Examples 11-12 were tested as described above. The results are set forth below.

|  | Example | |
|---|---|---|
| Property | 11 | 12 |
| Melt Viscosity (Pa-s) at 350° C. | 52.3 | 85.4 |
| DTUL (° C.) | 279 | 279 |
| Tensile Strength (MPa) | 140 | 115 |
| Tensile Break Strain (%) | 2.0 | 1.1 |
| Tensile Modulus (MPa) | 12,975 | 14,087 |
| Flex Strength (MPa) | 200 | 173 |
| Flex Modulus (MPa) | 13,088 | 14,018 |
| Notched Charpy Impact Strength (kJ/m$^2$) | 36 | 12 |
| Avg. Dielectric Constant (Dk) | 5.260 | 6.265 |
| Avg. Dissipation Factor (Df) | 0.0042 | 0.0048 |

EXAMPLES 13-16

Thermoplastic compositions are formed from a LDS polymer concentrate, liquid crystalline polymer, rutile titanium dioxide (Tiona™ RCL-4 from Millennium), and Advantex™ E glass fibers. The polymer concentrate contained 30.0 wt. % of a copper chromite filler (Shepherd IGM) and 70 wt. % of a liquid crystalline polymer. In some cases, a polymer concentrate containing 25 wt. % graphite and 75 wt. % of a liquid crystalline polymer are also employed. The polymer of Examples 13 and 14 is the same as employed in Example 1, and the polymer of Examples 15 and 16 is the same as employed in Example 5.

The constituents of each Example are set forth below in more detail.

|  | Example 13 | Example 14 | Example 15 | Example 16 |
|---|---|---|---|---|
| LCP | 47.2 | 55.5 | 46.2 | 54.5 |
| Glass Fibers | 20.0 | 20.0 | 20.0 | 20.0 |
| Shepherd 1GM | 6.0 | 6.0 | 6.0 | 6.0 |
| TiO$_2$ | 25.0 | 15.0 | 25.0 | 15.0 |
| Carbon Black | 1.5 | 1.0 | 1.5 | 1.0 |
| Graphite | — | 2.5 | — | 2.5 |
| ATH (Aluminum Trihydroxide) | — | — | 1.0 | 1.0 |

After formation of the composition, various thermal and mechanical properties were tested as described above. The results are set forth below.

| Property | Example 13 | Example 14 | Example 15 | Example 16 |
|---|---|---|---|---|
| Melt Viscosity (Pa-s) at 350° C. | 56.0 | 48.3 | 49.5 | 38.0 |
| Tensile Strength (MPa) | 144 | 150 | 145 | 150 |
| Strain at Break (%) | 1.51 | 1.71 | 1.70 | 1.90 |
| Tensile Modulus (MPa) | 15,570 | 14,980 | 15,100 | 14,500 |
| Notched Charpy Impact Strength (kJ/m$^2$) | 18 | 25 | 15 | 21 |
| DTUL (° C.) | 254 | 252 | 280 | 277 |
| Avg. Dielectric Constant (Dk) | 6.26 | 7.86 | 6.30 | 8.02 |
| Avg. Dissipation Factor (Df) | 0.0085 | 0.0115 | 0.0045 | 0.0060 |
| UL V0 Thickness | 0.25 | 0.25 | 0.25 | 0.25 |

These and other modifications and variations of the present invention may be practiced by those of ordinary skill in the art, without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A thermoplastic composition that comprises:
   from about 20 wt. % to about 80 wt. % of at least one thermotropic liquid crystalline polymer;
   from about 0.1 wt. % to about 30 wt. % of at least one laser activatable additive, wherein the laser activatable additive includes spinel crystals;
   from about 1 wt. % to about 50 wt. % of at least one dielectric material; and
   from about 5 wt. % to about 50 wt. % of at least one fibrous filler, wherein the weight ratio of the fibrous filler to the combined amount of the laser activatable additive and the dielectric material is from about 0.4 to about 2.0;
   wherein the thermoplastic composition exhibits a dielectric constant of greater than about 4.4, as determined at a frequency of 2 GHz, and further wherein the melting temperature of the thermoplastic composition is from about 250° C. to about 440° C., and wherein the composition exhibits a deflection temperature under load such that the ratio of the deflection temperature under load to the melting temperature is from about 0.67 to about 1.00, the deflection temperature under load being determined in accordance ISO Test No. 75-2 at a load of 1.8 Megapascals.

2. The thermoplastic composition of claim 1, wherein the thermotropic crystalline polymer is an aromatic polyester that contains repeating units derived from 4-hydroxybenzoic acid.

3. The thermoplastic composition of claim 2, wherein the aromatic polyester further contains repeating units derived from terephthalic acid, isophthalic acid, hydroquinone, 4,4-biphenol, or a combination thereof.

4. The thermoplastic composition of claim 1, wherein the spinel crystals having the following general formula:

AB$_2$O$_4$ wherein,
A is a metal cation having a valance of 2; and
B is a metal cation having a valance of 3.

5. The thermoplastic composition of claim 4, wherein the spinel crystals include MgAl$_2$O$_4$, ZnAl$_2$O$_4$, FeAl$_2$O$_4$, CuFe$_2$O$_4$, CuCr$_2$O$_4$, MnFe$_2$O$_4$, NiFe$_2$O$_4$, TiFe$_2$O$_4$, FeCr$_2$O$_4$, MgCr$_2$O$_4$, or a combination thereof.

6. The thermoplastic composition of claim 1, wherein the dielectric material includes a ferroelectric material.

7. The thermoplastic composition of claim 6, wherein the ferroelectric material includes BaTiO$_3$, SrTiO$_3$, CaTiO$_3$, MgTiO$_3$, SrBaTi$_2$O$_6$, NaBa$_2$Nb$_5$O$_{15}$, KBa$_2$Nb$_5$O$_{15}$, or a combination thereof.

8. The thermoplastic composition of claim 1, wherein the dielectric material includes a paraelectric material.

9. The thermoplastic composition of claim 8, wherein the paraelectric material includes TiO$_2$, Ta$_2$O$_5$, HfO$_2$, Nb$_2$O$_5$, Al$_2$O$_3$, or a combination thereof.

10. The thermoplastic composition of claim 1, wherein the dielectric material includes ceramic particles containing a surface treatment.

11. The thermoplastic composition of claim 10, wherein the surface treatment includes an organophosphorous compound.

12. The thermoplastic composition of claim 11, wherein the surface treatment includes a phosphorylated polyene.

13. The thermoplastic composition of claim 1, wherein the combined amount of the dielectric material and the laser activatable additive is within a range of from about 5 wt. % to about 50 wt. %.

14. The thermoplastic composition of claim 1, wherein the dielectric material includes carbon particles.

15. The thermoplastic composition of claim 1, wherein the fibrous filler includes glass fibers.

16. The thermoplastic composition of claim 15, wherein the glass fibers have an aspect ratio of from about 5 to about 50.

17. The thermoplastic composition of claim 15, wherein the glass fibers have a weight average length of from about 100 to about 800 micrometers.

18. The thermoplastic composition of claim 1, wherein the composition has a melt viscosity of from about 5 to about 100 Pa-s, as determined at a shear rate of 1000 seconds$^{-1}$ and a temperature of 350° C. in accordance with ASTM Test No. 1238-70.

19. The thermoplastic composition of claim 1, wherein the composition exhibits a dissipation factor of from about 0.0001 to about 0.0055, as determined at a frequency of 2 GHz.

20. A molded part that comprises the thermoplastic composition of claim 1.

21. The molded part of claim 20, wherein the part has a thickness of about 5 millimeters or less.

22. The molded part of claim 20, wherein the part exhibits a Charpy notched impact strength of greater than about 6 kJ/m$^2$, as determined according to ISO Test No. 179-1 at 23° C.

23. The molded part of claim 20, wherein the part exhibits a V0 rating at a thickness of 0.8 mm as determined in accordance with UL94.

24. The molded part of claim 20, wherein one or more conductive elements are formed on a surface of the part by a method that includes exposing the surface to a laser and thereafter metallizing the exposed surface.

25. An electronic component that comprises the molded part of claim 20.

26. An implantable medical device that comprises the molded part of claim 20.

27. A thermoplastic composition that comprises a thermotropic liquid crystalline polymer having a total amount of repeating units derived from naphthenic hydroxcarboxylic and/or naphthenic dicarboxylic acids of about 10 mol. % or more, a laser activatable additive, a dielectric material, and a fibrous filler, wherein the laser activatable additive includes spinel crystals.

28. The thermoplastic composition of claim 27, wherein the composition comprises from about 20 wt. % to about 80 wt. % of the thermotropic liquid crystalline polymer; from about 0.1 wt. % to about 30 wt. % of the laser activatable additive; from about 1 wt. % to about 50 wt. % of the dielectric material; and from about 5 wt. % to about 50 wt. % of the fibrous filler.

29. The thermoplastic composition of claim 27, wherein the weight ratio of the fibrous filler to the combined amount of the laser activatable additive and the dielectric material is from about 0.4 to about 2.0.

30. The thermoplastic composition of claim 27, wherein the composition exhibits a dielectric constant of greater than about 4.4, as determined at a frequency of 2 GHz.

31. The thermoplastic composition of claim 27, wherein the melting temperature of the thermoplastic composition is from about 250° C. to about 440° C.

32. The thermoplastic composition of claim 27, wherein the composition exhibits a deflection temperature under load such that the ratio of the deflection temperature under load to the melting temperature is from about 0.67 to about 1.00, the deflection temperature under load being determined in accordance ISO Test No. 75-2 at a load of 1.8 Megapascals.

33. An antenna structure that comprises:
   a substrate that includes a thermoplastic composition comprising at least one thermotropic liquid crystalline polymer, at least one laser activatable additive that includes spinel crystals, at least one dielectric material, and at least one fibrous filler, wherein the weight ratio of the fibrous filler to the combined amount of the laser activatable additive and the dielectric material is from about 0.4 to about 2.0; and
   one or more antennae formed on the substrate.

34. The antenna structure of claim 33, wherein the fibrous filler includes glass fibers.

35. The antenna structure of claim 33, wherein the thermotropic liquid crystalline polymer has a total amount of repeating units derived from naphthenic hydroxcarboxylic and/or naphthenic dicarboxylic acids of more than 10 mol. %.

36. The antenna structure of claim 33, wherein the thermoplastic composition exhibits a dielectric constant of greater than about 4.4, as determined at a frequency of 2 GHz.

37. The antenna structure of claim 33, wherein the composition exhibits a dissipation factor of from about 0.0001 to about 0.0055, as determined at a frequency of 2 GHz.

38. An electronic component that comprises the antenna structure of claim 33.

39. The electronic component of claim 38, wherein the component is a cellular telephone.

\* \* \* \* \*